(12) United States Patent
Kim et al.

(10) Patent No.: US 7,881,121 B2
(45) Date of Patent: Feb. 1, 2011

(54) DECODING METHOD IN AN NROM FLASH MEMORY ARRAY

(75) Inventors: Jongoh Kim, Hsinchu (TW); Yi-Jin Kwon, Hsinchu (TW); Cheng-Jye Liu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/534,696

(22) Filed: Sep. 25, 2006

(65) Prior Publication Data

US 2008/0084753 A1 Apr. 10, 2008

(51) Int. Cl.
G11C 11/34 (2006.01)

(52) U.S. Cl. .............. 365/185.25; 365/185.03; 365/185.18; 365/189.08; 365/203

(58) Field of Classification Search ........... 365/185.25, 365/185.03, 185.18, 185.23, 189.15, 189.08, 365/203
See application file for complete search history.

(56) References Cited

U.S. PATENT DOCUMENTS

| | | | |
|---|---|---|---|
| 4,947,376 A | 8/1990 | Arimoto et al. | |
| 5,449,633 A * | 9/1995 | Bergemont | 438/276 |
| 5,768,192 A * | 6/1998 | Eitan | 365/185.24 |
| 5,969,990 A * | 10/1999 | Arase | 365/185.25 |
| 6,011,725 A * | 1/2000 | Eitan | 365/185.33 |
| 6,222,768 B1 * | 4/2001 | Hollmer et al. | 365/185.16 |
| 6,373,746 B1 * | 4/2002 | Takeuchi et al. | 365/185.03 |
| 6,477,083 B1 * | 11/2002 | Fastow et al. | 365/185.16 |
| 6,510,082 B1 | 1/2003 | Le et al. | |
| 6,525,969 B1 * | 2/2003 | Kurihara et al. | 365/185.25 |
| 6,529,412 B1 * | 3/2003 | Chen et al. | 365/185.21 |
| 6,731,542 B1 * | 5/2004 | Le et al. | 365/185.21 |
| 6,807,119 B2 * | 10/2004 | Fasoli et al. | 365/210.1 |
| 6,987,693 B2 * | 1/2006 | Cernea et al. | 365/185.12 |
| 7,190,605 B1 * | 3/2007 | Richter et al. | 365/94 |
| 7,218,563 B1 * | 5/2007 | Lin et al. | 365/203 |

(Continued)

FOREIGN PATENT DOCUMENTS

CN 1139075 1/1997

OTHER PUBLICATIONS

Wu et al., An Asymmetric Two-Side Program With One-Side Read (ATPOR) Device for MultiBit Per Cell MLC Nitride-Trapping Flash Memories, IEEE Transactions on Electron Devices, Dec. 2005, pp. 2648-2653, vol. 52, No. 12.

Primary Examiner—Hoai V Ho
Assistant Examiner—Jay Radke
(74) Attorney, Agent, or Firm—Jianq Chyun IP Office

(57) ABSTRACT

A read operation method is provided for a flash memory array having a plurality of memory cells, wordlines, even bitlines, odd bitlines and a plurality of bitline transistors. The method includes pre-charging the plurality of even bitlines to about Vcc/n and pre-charging the plurality of odd bitlines to ground. The current flowing to/from a first bit location in each of the memory cells is selectively sensed. A logical state is determined from the sensed current for the first bit location in each of the memory cells. The method also includes pre-charging the plurality of odd bitlines to about Vcc/n and pre-charging the plurality of even bitlines to ground. The current flowing to/from a second bit location in each of the memory cells is selectively sensed. A logical state is determined from the sensed current for the second bit location in each of the memory cells.

8 Claims, 9 Drawing Sheets

U.S. PATENT DOCUMENTS

| | | | |
|---|---|---|---|
| 7,233,514 B2 * | 6/2007 | Curatolo et al. | 365/100 |
| 7,408,806 B2 * | 8/2008 | Park et al. | 365/185.17 |
| 2003/0012051 A1 * | 1/2003 | Iioka et al. | 365/185.16 |
| 2006/0092709 A1 * | 5/2006 | Hsieh et al. | 365/185.29 |
| 2007/0002645 A1 * | 1/2007 | Roehr et al. | 365/195 |
| 2007/0035992 A1 * | 2/2007 | Curatolo et al. | 365/185.02 |
| 2007/0115737 A1 * | 5/2007 | Lin et al. | 365/203 |

* cited by examiner

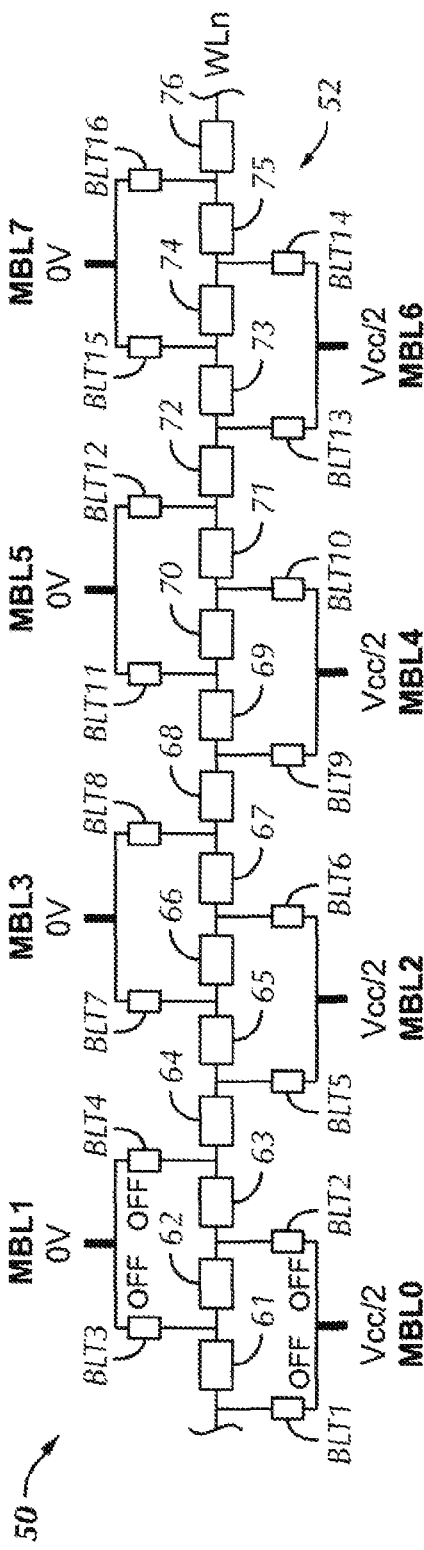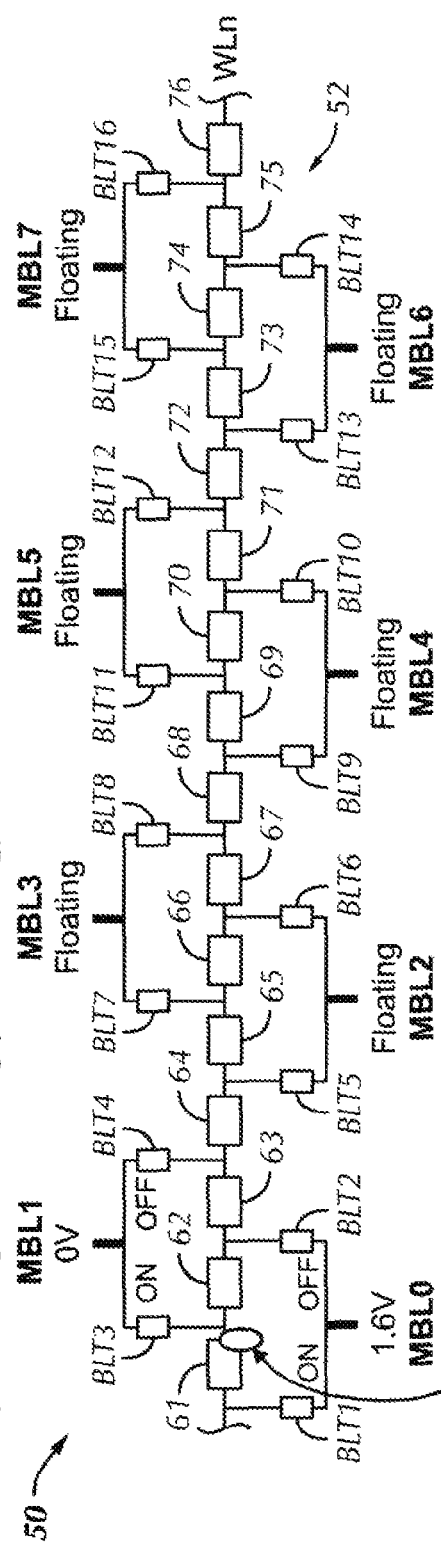
FIG. 4A — Step 1. Before Sensing (Without BLT Coding = All Off State)
FIG. 4B — Step 2. During the Sensing (With Coding) Right Side of Cell 61 Reading (BLT1, BLT3 = ON)

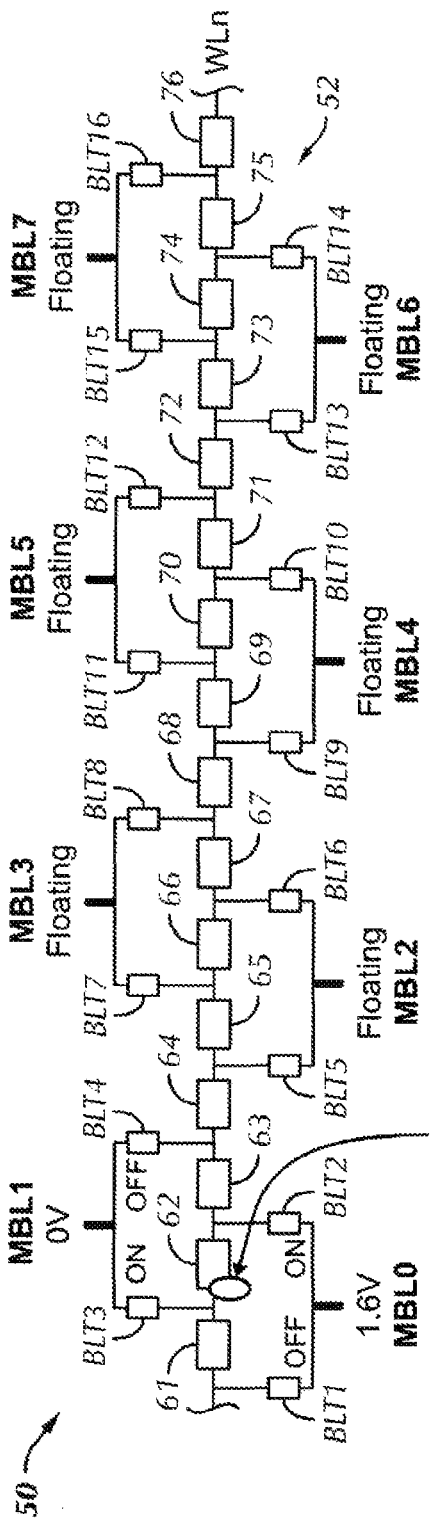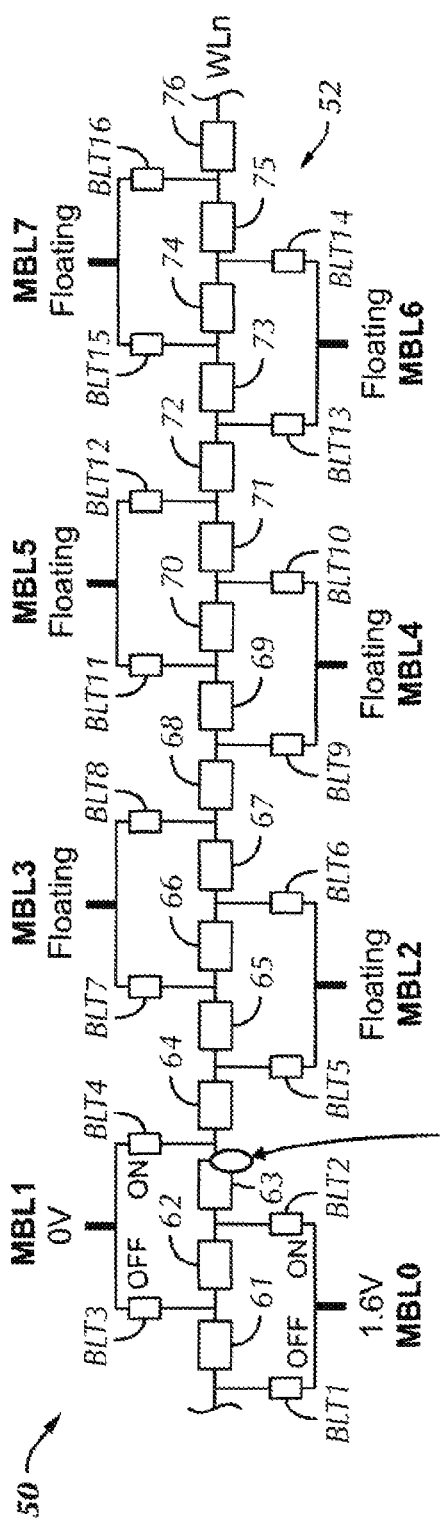

DECODING METHOD IN AN NROM FLASH MEMORY ARRAY

BACKGROUND OF THE INVENTION

The present invention relates to a decoding arrangement for flash memory, and more particularly, to a method of precharging and decoding a memory array having a plurality of bitline transistors.

Non-volatile memory ("NVM") refers to semiconductor memory which is able to continually store information even when the supply of electricity is removed from the device containing such an NVM memory cell. Typically, NVM can be programmed with data, read and/or erased, and the programmed data can be stored for a long period of time prior to being erased. "Flash memory" is a special NVM which is an electrically erasable programmable read only memory (EEPROM) that is known in the art.

Flash memory typically stores information in an array of transistors, commonly referred to as "cells," each of which traditionally stores one bit of information. Flash memory is based on the Floating-Gate Avalanche-Injection Metal Oxide Semiconductor (FAMOS transistor) which is essentially an n-type Metal Oxide Semiconductor (NMOS) transistor with an additional floating conductor "suspended" by insulating materials between the gate and source/drain terminals. Conventional flash memories are constructed in a cell structure wherein a single bit of information is stored in each flash memory cell. Each memory cell typically includes a MOS transistor structure having a source, a drain, and a channel in a substrate or P-well and a "stacked gate" overlying the channel. The stacked gate may further include a thin gate dielectric layer, referred to as a tunnel oxide, formed on the surface of the P-well. The stacked gate also includes a polysilicon floating gate overlying the tunnel oxide and an interpoly dielectric layer overlying the floating gate. The interpoly dielectric layer is typically a multilayer insulator such as an oxide-nitride-oxide (ONO) layer having two oxide layers sandwiching a nitride trapping layer. A polysilicon control gate normally overlies the interpoly dielectric layer, and therefore, such flash memory cells are sometimes referred to as Nitride Read Only Memory (NROM).

FIG. 1 is a cross sectional view of a conventional flash memory cell 500. The conventional floating gate flash memory cell 500 includes and n$^+$ type source 504, a p type channel 505, an n$^+$ type drain 512 and a p-type substrate 502. A floating gate 506 is sandwiched between an insulating dielectric layer 510 and thin tunnel oxide layer 514 over the channel 505. The floating gate 506 provides the memory storage element for the flash memory cell 500 and is electrically insulated from other elements of the memory cell 500 by the thin tunnel oxide layer 514 and the insulating dielectric layer 510. Control gate 508 is located on top of the insulating dielectric layer 510 and is positioned over the floating gate or nitride trapping layer 506. The floating gate 506 is electrically isolated from the control gate 508 by the insulating layer 510 such as a layer of silicon dioxide (SiO$_2$) or an interpoly layer such as an oxide-nitride-oxide (ONO) interpoly oxide 510. The conventional flash memory cell 500 shown is basically an n-channel transistor with the addition of a floating gate 506. Electrical "access" or coupling to the floating gate 506 takes place only through a capacitor network of surrounding SiO$_2$ layers and source 504, drain 512, channel 505, and control gate 508. Any charge present on the floating gate 506 is retained due to the inherent Si—SiO$_2$ energy barrier height, thereby creating a non-volatile memory.

FIG. 2 schematically depicts a conventional array 520 of memory cells 500 diagrammatically showing a conventional read method. The memory cells 500 are generally arranged in a grid on the substrate 502. Wordlines WL0-WL31 are connected to the gates 508 each of the memory cells 500 in each row. Bitlines MBL0-MBL5 are selectively coupled to the source or drain of each of the memory cells 500 in each column. Control transistors SEL0-SEL1 select a path for programming, reading or erasing a particular cell 500 on a particular bitline MBL0-MBL5 and wordline WL0-WL31.

Programming a flash memory cell 500 means that charge (i.e., electrons) is added to the floating gate 506. A high drain to source or source to drain bias voltage is applied along with a high control gate voltage $V_g$. The control gate voltage $V_g$ inverts the channel 505, while the bias accelerates electrons toward the drain 512 or source 514. In the process of crossing the channel 505, some electrons collide with the silicon lattice and become redirected toward the Si—SiO$_2$ interface. With the aid of the field produced by the gage voltage $V_g$ some of the electrons travel across the thin oxide layer 514 and become added to the floating gate 506. The resulting high electric field across the tunnel oxide 514 leads to a phenomena called "Fowler-Nordheim" tunneling ("FN tunneling"). Electrons in the cell channel region 505 tunnel through the gate oxide 514 into the floating gate 506 and become "trapped" in the floating gate 506 since the floating gate 506 is surrounded by the interpoly dielectric layer 510 and the tunnel oxide 514. After programming is completed the electrons added to the floating gate 506 increase the cell's threshold voltage. This change in the threshold voltage, and thereby the channel conductance, of the cell 500 created by the trapped electrons is what causes the cell 500 to be programmed.

Programming is selectively performed on each individual cell 500 in the array 520 of memory cells 500. An individual flash cell 500 is selected via its respective wordline WL0-WL31 (FIG. 2) and a pair of bitlines MBL0-MBL5 bounding the associated cell 500. A virtual ground is formed by selectively switching to ground the bitline MBL0-MBL4 associated with the source terminal 504 of only those selected flash cells 500 which are to be programmed or read.

Reading a flash memory cell 500 is performed using a sense amplifier (not shown in FIG. 2). For cells 500 that have been programmed, the turn-on voltage Vt of cells is increased by the increased charge on the floating gate 500. By applying a control gate voltage $V_g$ and monitoring the drain current, differences between a cell 500 with charge and a cell 500 without charge on the respective floating gates 506 can be determined. A sense amplifier compares cell drain current with that of a reference cell such as a flash memory cell 500 which is programmed to the reference level during a manufacturing test. An erased memory cell 500 has more cell current than the reference cell and therefore is a logical "1" whereas a programmed memory cell 500 draws less current that the reference cell and is a logical "0."

Erasing a flash memory cell 500 means that electrons (charge) are removed from the floating gate 506. Erasing flash memory is performed by applying electrical voltages to many cells at once so that the memory cells 500 are erased in a "flash." A typical erase operation in a flash memory cell 500 may be performed by applying a positive voltage to the source 504, a negative or a ground voltage to the control gate 508 and holding substrate 502 of the flash memory cells 500 at ground potential. The drain 512 is allowed to "float." Under these conditions, a high electric field is present between the floating gate 506 and the source 504. The source junction experiences a gated-diode condition during erase and electrons that manage to tunnel through the first few angstroms of the SiO₂ of the tunnel oxide layer 514 are then swept into the source 504. After the erase operation has been completed, electrons have been removed from the floating gate 506 thereby reducing the cell threshold voltage Vt. While programming is selective to each individual flash memory cell 500, an erase operation typically includes many flash memory cells 500 in an array 520 being erased simultaneously.

Programming, reading and erasing flash memory cells 500 in a memory array is accomplished by a combination of bitlines and wordlines. Bitline and wordline transistors control voltage and current flow to particular memory cells 500 via the bitlines and wordlines and allow other bitlines to discharge during program, read and erase operations.

It is desirable to improve the read speed of NROM cells using a pre-charge method. It is also desirable to reduce power consumption and noise during decoding changeover by avoiding power changes during decoding changeover. It is desirable to use about Vcc/n as the pre-charge voltage, wherein n is greater than 1.

BRIEF SUMMARY OF THE INVENTION

Briefly stated, an embodiment of the present invention comprises a read operation method for a flash memory array having a plurality of memory cells, a plurality of wordlines, a plurality of even bitlines, a plurality of odd bitlines and a plurality of bitline transistors. The method includes pre-charging the plurality of even bitlines to about Vcc/n and pre-charging the plurality of odd bitlines to ground. The current flowing to/from a first bit location in each of the memory cells is selectively sensed. A logical state is determined from the sensed current on the source side or the drain side of each cell in the first bit location in each of the memory cells. The method also includes pre-charging the plurality of odd bitlines to about Vcc/n and pre-charging the plurality of even bitlines to ground. The current flowing to/from a second bit location in each of the memory cells is selectively sensed. A logical state is determined from the sensed current on the source side or the drain side for the second bit location in each of the memory cells.

Another embodiment of the present invention comprises a read operation method for a flash memory array having a plurality of memory cells, a plurality of wordlines, a plurality of even bitlines, a plurality of odd bitlines and a plurality of bitline transistors. The plurality of even bitlines are temporarily pre-charged to about Vcc/n, wherein n is greater than 1. The plurality of odd bitlines are temporarily pre-charged to one of a ground and a virtual ground level. The current flowing to/from a first bit location in each of the plurality of memory cells is selectively sensed. A logical state status from the sensed current on one of the source side and the drain side is determined for the first bit location in each of the plurality of memory cells.

Another embodiment of the present invention comprises a read operation method for a flash memory array having a plurality of memory cells, a plurality of wordlines, a plurality of even bitlines, a plurality of odd bitlines and a plurality of bitline transistors. The plurality of even bitlines are temporarily pre-charged to about Vcc/n, wherein n is greater than 1. The plurality of odd bitlines are temporarily pre-charged to one of a ground and a virtual ground level. The current flowing to/from a first bit location in each of the plurality of memory cells is selectively sensed by selectively controlling bitline transistors coupled to each of the plurality of memory cells. A logical state status from the sensed current on one of the source side and the drain side is determined for the first bit location in each of the plurality of memory cells. The plurality of odd bitlines are temporarily pre-charged to about Vcc/n. The plurality of even bitlines are temporarily pre-charged to one of a ground and a virtual ground level. The current flowing to/from a second bit location in each of the plurality of memory cells is selectively sensed by selectively controlling the bitline transistors coupled to each of the plurality of memory cells.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there is shown in the drawings an embodiment which are presently preferred. It should be understood, however, that the invention is not limited to the precise arrangements and instrumentalities shown. In the drawings:

FIGS. 4A-4E are schematic diagrams of a portion of a flash memory array having a plurality of bitline transistors diagrammatically showing a read pre-charge method for odd bitlines in accordance with the preferred embodiment of the present invention.

DETAILED DESCRIPTION OF THE INVENTION

Figure 1:
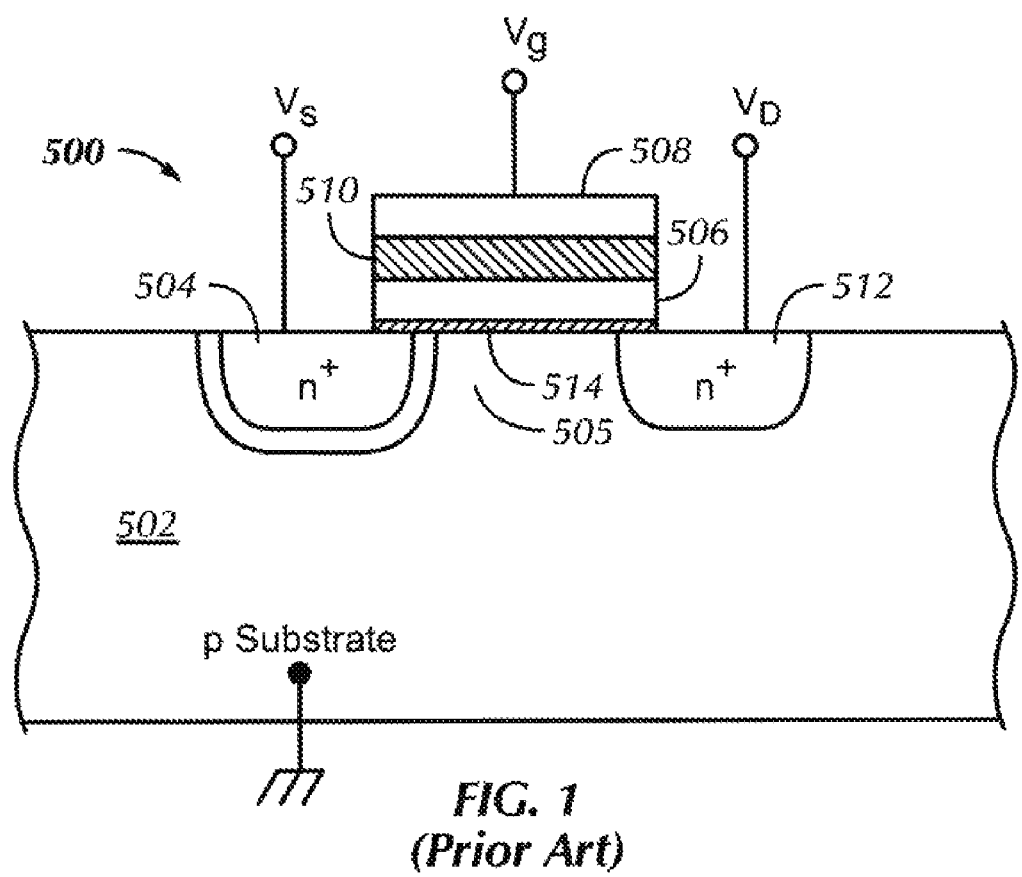
FIG. 1 is a cross sectional view of a flash memory cell of the prior art.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the words "a" and "an," as used in the claims and in the corresponding portions of the specification, means "at least one."

Referring to the drawings in detail, wherein like reference numerals indicate like elements throughout, there is shown in FIGS. 3A-3E and 4A-4E a portion of a flash memory array 50 having a plurality of bitline transistors BLT1-BLT16 and a plurality of memory cells 61-76. FIGS. 3A-3E and 4A-4E diagrammatically show a read pre-charge method in accordance with the preferred embodiment of the present invention. FIG. 5 is a schematic diagram of the flash memory array 50 of FIGS. 3A-3E and 4A-4E showing decoding circuits 30 and pre-charge circuit 20 in accordance with the preferred embodiment of the present invention.

Generally, the preferred embodiment of the present invention provides a Y-path decoding method for NROM memory cells 61-76 in the flash memory array 50 which utilizes about Vcc/n as the pre-charging source, wherein n is greater than 1. Preferably, the Y-path decoding method for NROM memory cells 61-76 utilizes about Vcc/2 as the pre-charging source.

The memory array 50 is formed on a semiconductor substrate 52. The memory array 50 also includes a plurality of wordlines WLn (only one row of the array 50 is shown for simplicity) and a plurality of bitlines MBL0-MBL7 where MBL0, MBL2, MBL4 and MBL6 are the even bitlines and MBL1, MBL3, MBL5 and MBL7 are the odd bitlines. The plurality of memory cells 61-76 are disposed in the substrate 52. The memory cells 61-76 are the same as the conventional memory cell 500 described in detail in the Background of the Invention Section. The wordlines WLn are electrically coupled to the gates 508 of the memory cells 61-76.

Figure 2:
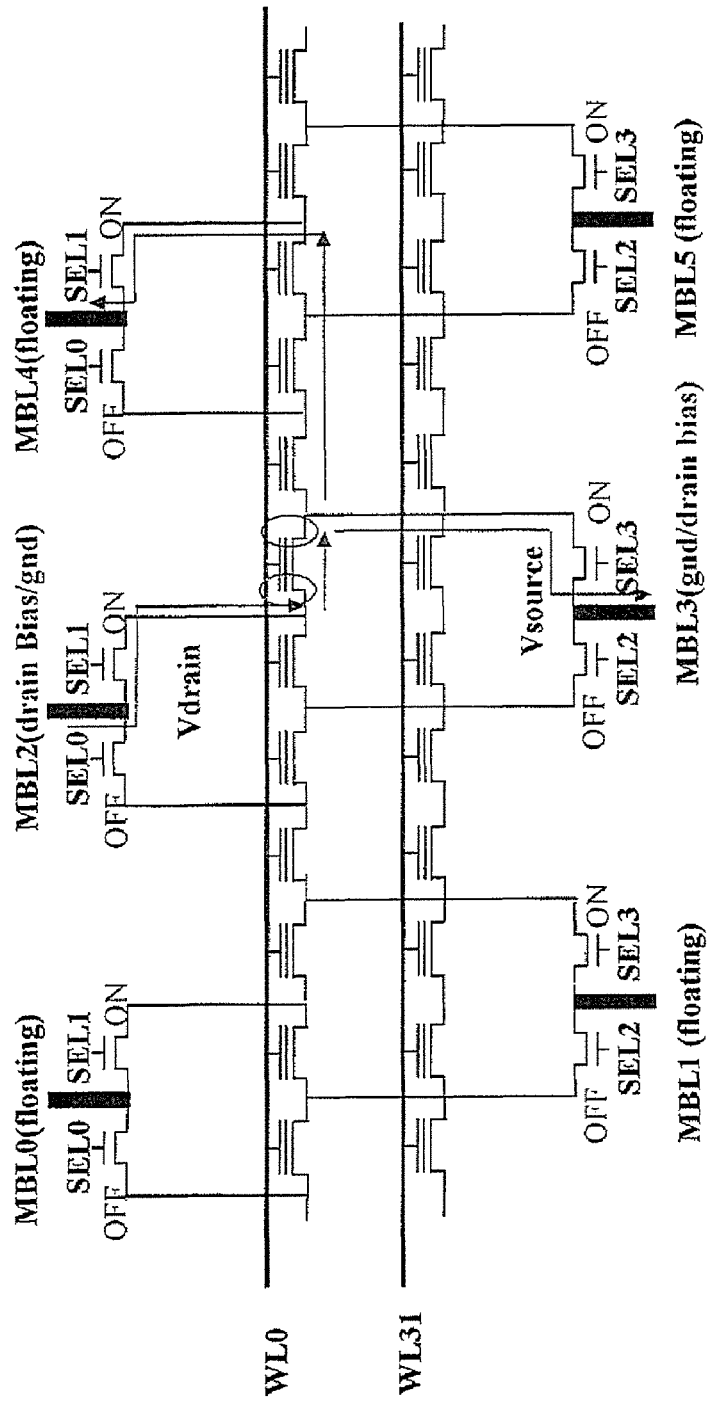
FIG. 2 is a schematic diagram of a flash memory array having a plurality of bitline transistors of the prior art diagrammatically showing a read pre-charge method of the prior art.

The plurality of wordlines WLn are generally parallel to and spaced apart from one another similar to the conventional memory array 520 shown in FIG. 2. The plurality of bitlines MBL1-MBL7 are generally parallel to and spaced apart from one another, and the plurality of wordlines WLn are generally perpendicular to the plurality of bitlines MBL1-MBL7 so that the plurality of wordlines WLn and the plurality of bitlines MBL1-MBL7 form a matrix.

The drain and source terminals 504, 512 of cells 61-76 associated with a given wordline WLn are coupled in series between respective bit lines MBL0-MBL7, and the gates 508 of the memory cells 61-76 are coupled to respective wordlines WLn. For example, as shown in FIGS. 3A-3E and 4A-4E, the gate 508 of memory cell 61 is coupled to wordline WLn, the source 504 of memory cell 61 is coupled to bitline MBL0 through bitline transistor BLT1 and the drain of memory cell 61 is coupled to bitline MBL1 through bitline transistor BLT3. Likewise, the gate 508 of memory cell 62 is coupled to wordline WLn, the source 504 of memory cell 62 is coupled to bitline MBL1 through bitline transistor BLT3 and the drain of memory cell 62 is coupled to bitline MBL0 through bitline transistor BLT2 and so on.

The pre-charging and decoding method in accordance with the preferred embodiment is performed in two steps diagrammatically depicted in FIGS. 3A-3E and 4A-4E, respectively. The method includes a pre-charge step and a sequential read method where a first bit location is read first, then power is switched, and a second bit location is read second or vice versa.

Figure 3A:
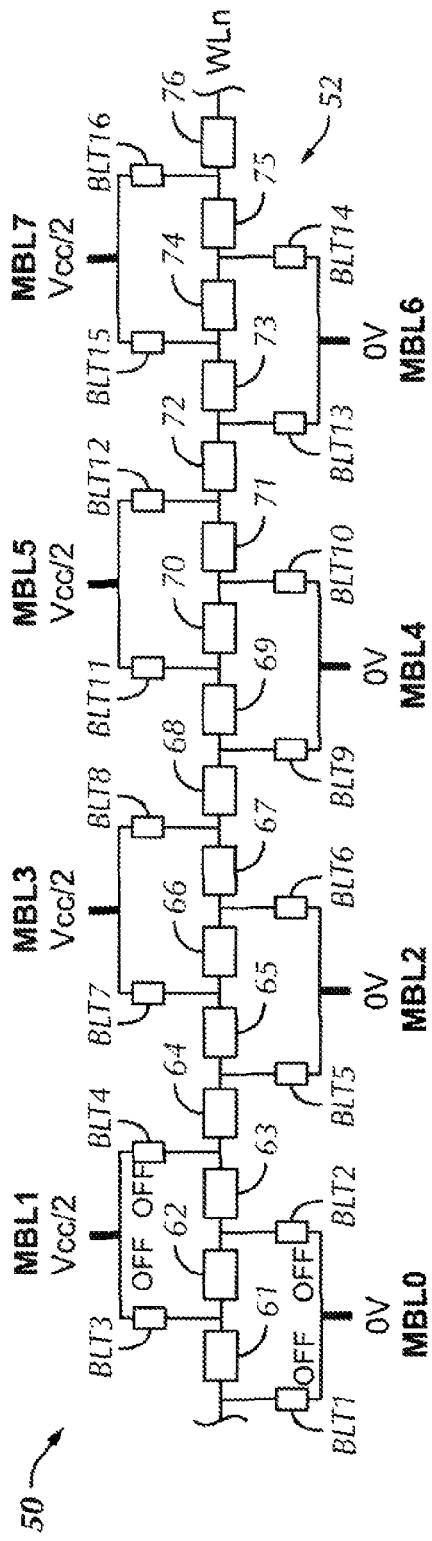
FIGS. 3A-3E are schematic diagrams of a portion of a flash memory array having a plurality of bitline transistors diagrammatically showing a read pre-charge method for even bitlines in accordance with the preferred embodiment of the present invention.
Figure 3B:
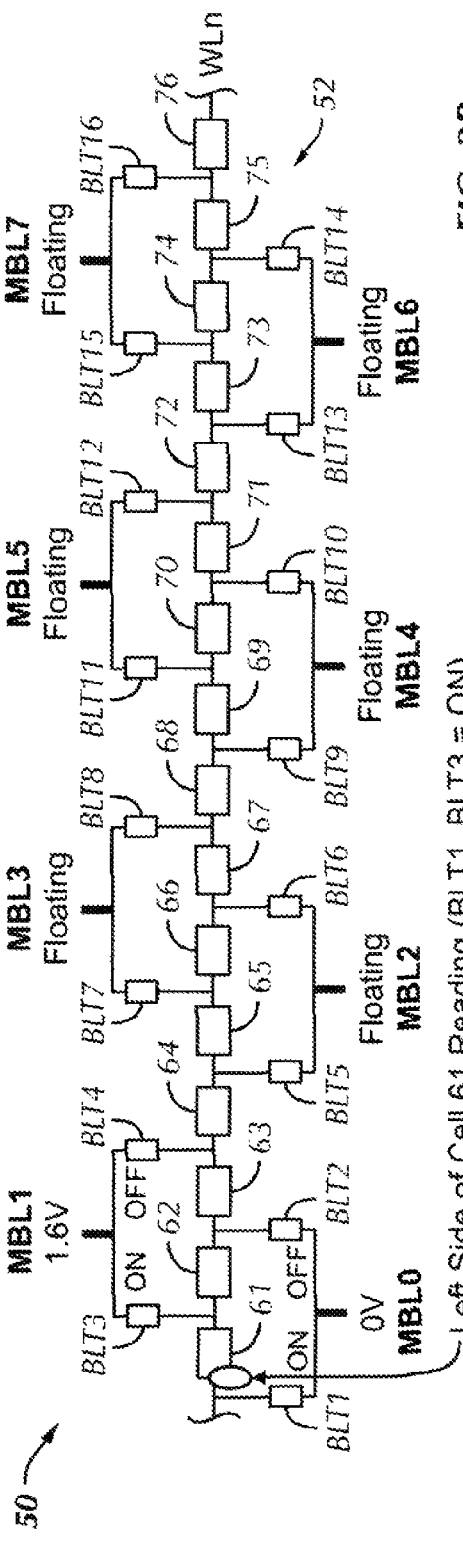
Figure 3C:
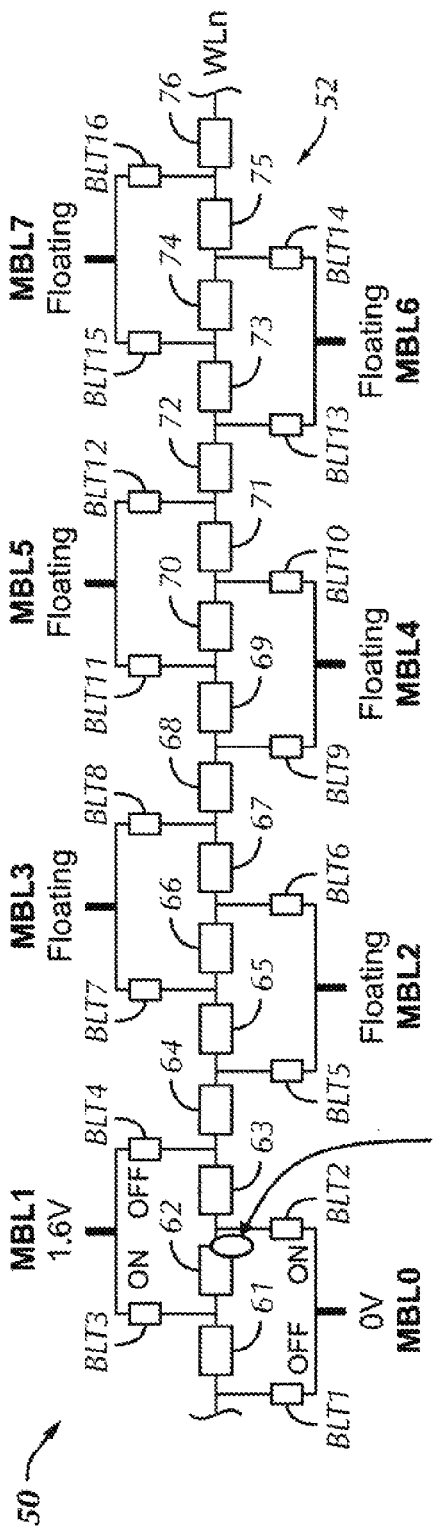
Figure 3D:
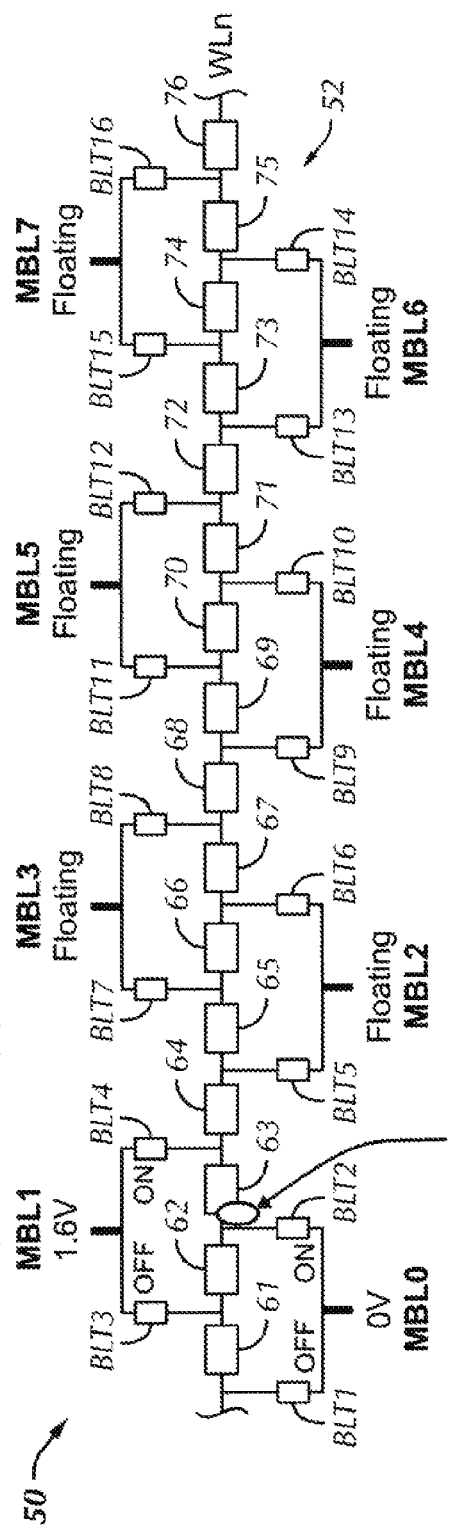
Figure 3E:
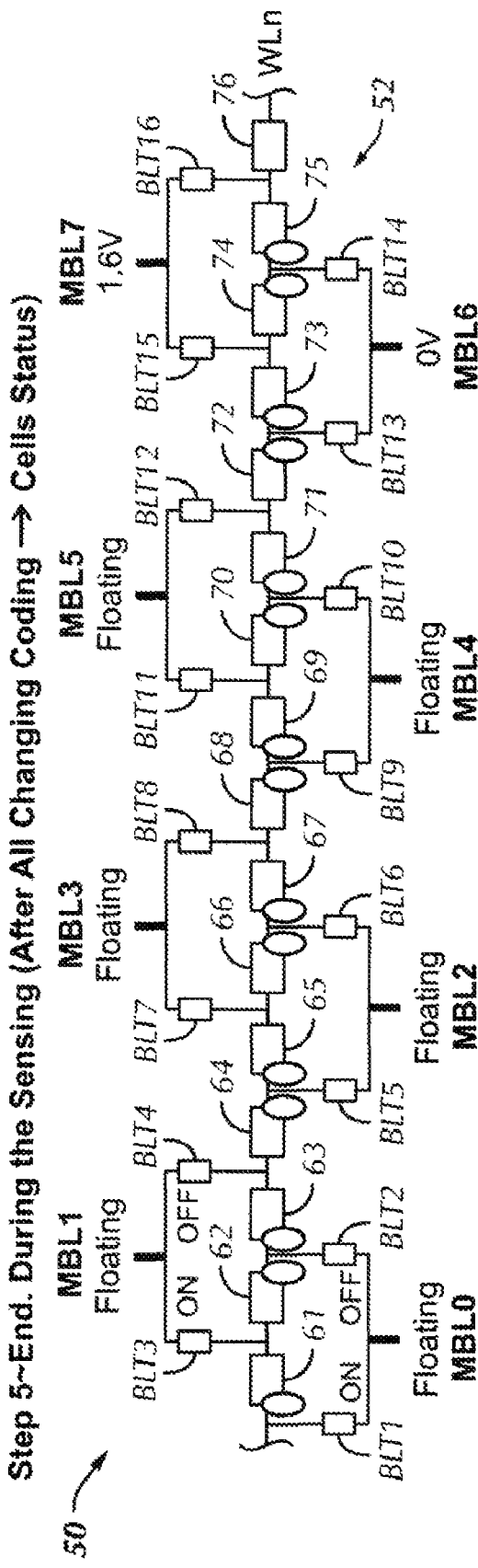

In FIG. 3A, the upper or odd bitlines MBL1, MBL3, MBL5, MBL7 are pre-charged to approximately Vcc/n, wherein n is greater than 1, while the lower or even bitlines MBL0, MBL2, MBL4, MBL6 are pre-charged to approximately 0 volts or ground or virtual ground (e.g., Vss). For example, the upper or odd bitlines MBL1, MBL3, MBL5, MBL7 may be pre-charged to about Vcc/2. In FIG. 3B, the left bit of memory cell 61 is read while bitline transistors BLT1 and BLT3 are on and bitline transistors BLT2 and BLT4 are off. The read bias voltage may be about 1.2-1.6 V, but other read bias voltages may be utilized. In FIG. 3C, a right bit of memory cell 62 is read while bitline transistors BLT2 and BLT3 are on and bitline transistors BLT1 and BLT4 are off. In FIG. 3D, the left bit of memory cell 63 is read while bitline transistors BLT2 and BLT4 are on and bitline transistors BLT1 and BLT3 are off. FIG. 3E shows that after all of the bitline transistor coding changes have been made, the actual logical status is known for the left bit of memory cell 61, the right bit of memory cell 62, the left bit of memory cell 63, the right bit of memory cell 64 and so on, for all of the memory cells 61-76.

Figure 4E:
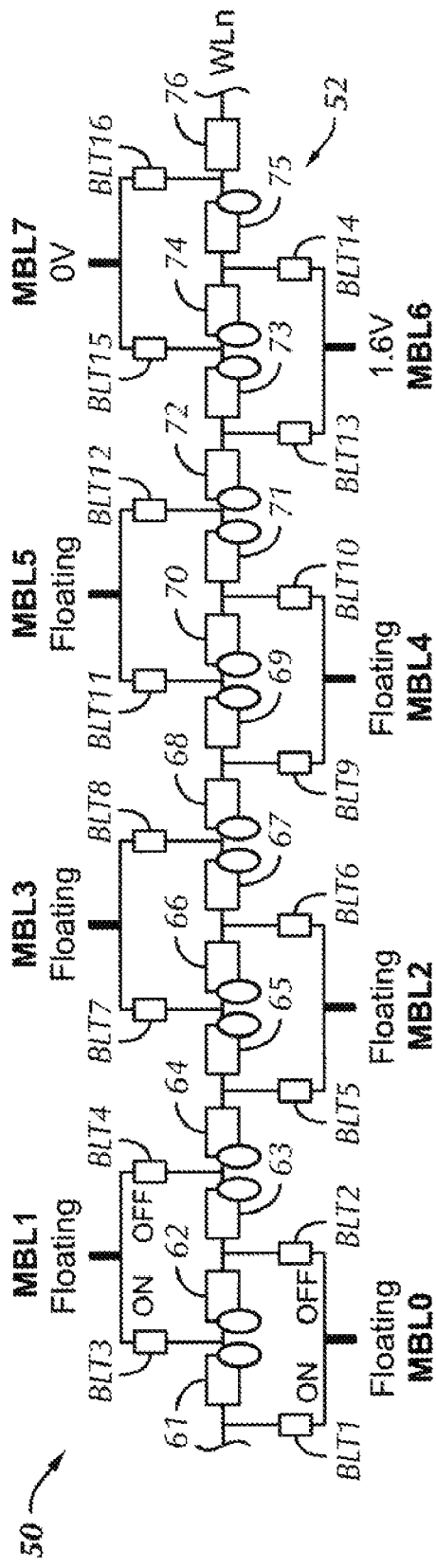
Figure 5:
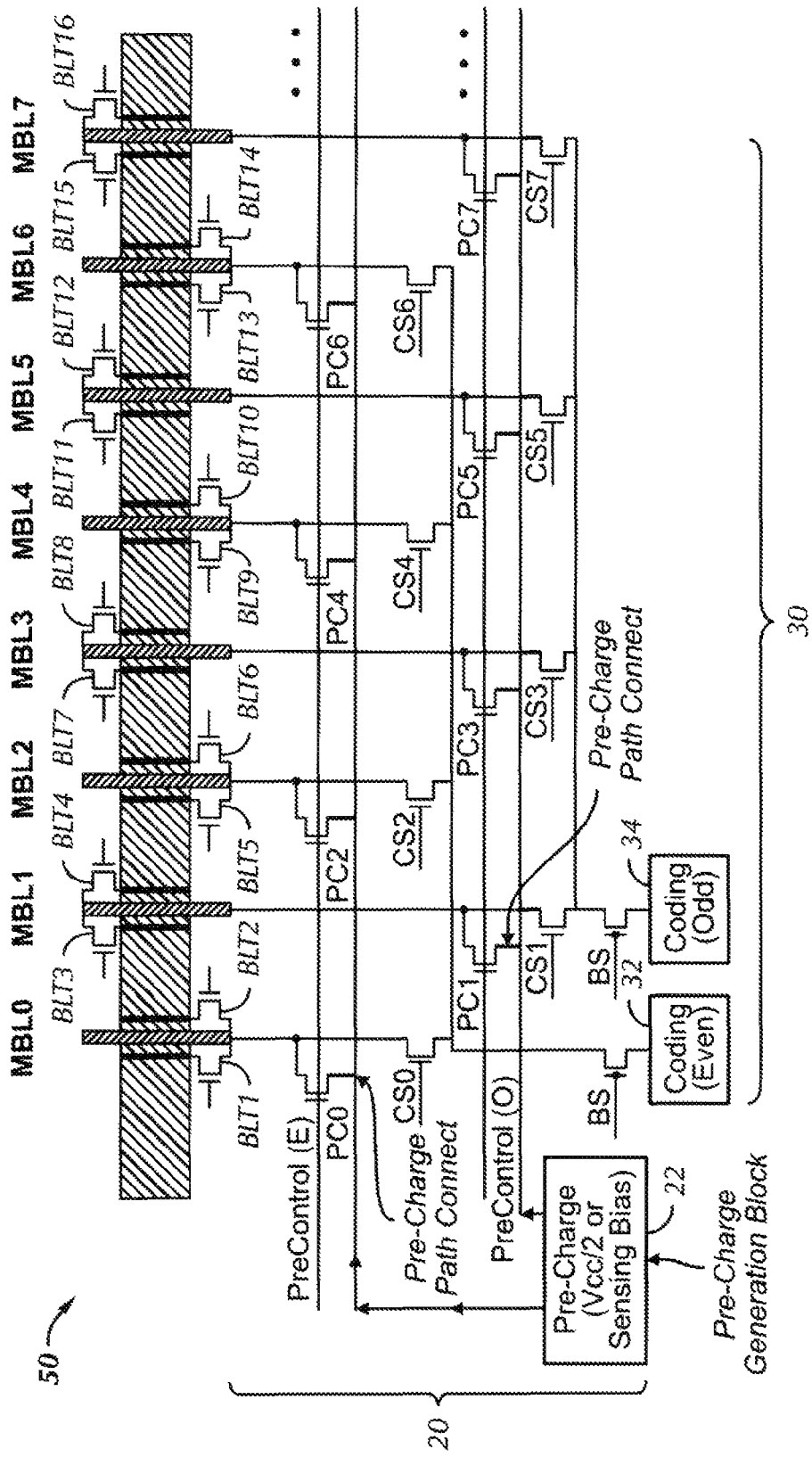
FIG. 5 is a schematic diagram of the flash memory array of FIGS. 3A-3E and 4A-4E showing decoding and pre-charge circuits in accordance with the preferred embodiment of the present invention.

In FIG. 4A, the upper or odd bitlines MBL1, MBL3, MBL5, MBL7 are pre-charged to 0 volts or ground or virtual ground (e.g., Vss) while the lower or even bitlines MBL0, MBL2, MBL4, MBL6 are pre-charged to approximately Vcc/n, wherein n is greater than 1. For example, the lower or even bitlines MBL0, MBL2, MBL4, MBL6 may be pre-charged to about Vcc/2. In FIG. 4B, the right bit of memory cell 61 is read while bitline transistors BLT1 and BLT3 are on and bitline transistors BLT2 and BLT4 are off. The read bias voltage may be about 1.2-1.6 V, but other read bias voltages may be utilized. In FIG. 4C, a left bit of memory cell 62 is read while bitline transistors BLT2 and BLT3 are on and bitline transistors BLT1 and BLT4 are off. In FIG. 4D, the right bit of memory cell 63 is read while bitline transistors BLT2 and BLT4 are on and bitline transistors BLT1 and BLT3 are off. FIG. 4E shows that after all of the bitline transistor coding changes have been made, the actual logical status is known for the right bit of memory cell 61, the left bit of memory cell 62, the right bit of memory cell 63, the left bit of memory cell 64 and so on, for all of the memory cells 61-76.

Thus, the left bit and right bit of each memory cell 61-76 are read in separate sequences by using coding of the bitline transistors BLT1-BLT16 in combination by changing whether the even bitlines MBL0, MBL2, MBL4 and MBL6 or the odd bitlines MBL1, MBL3, MBL5 and MBL7 are pre-charged and coupled to the read bias. For some of the memory cells 61-76, the first bit location is the left bit and the second bit location is the right bit. For others of the memory cells 61-76, the first bit location is the right bit and the second bit location is the left bit. Discharging from Vcc to ground or virtual ground (e.g., Vcc) occurs only after the sequence depicted in FIGS. 3A-3E.

Referring to FIG. 5 the pre-charge circuit 20 includes a pre-charge source/sensor 22 and a plurality of pre-charge control transistors PC0-PC7 coupled between the pre-charge source/sensor 22 and each of the respective wordlines MBL0-MBL7. The gates of the even pre-charge control transistors PC0, PC2, PC4, PC6 are driven in common by a pre-control even command and the gates of the odd pre-charge control transistors PC1, PC3, PC5, PC7 are driven in common by a pre-control odd command.

When the pre-control even command drives the gates of the even pre-charge control transistors PC0, PC2, PC4, PC6, the pre-charge source/sensor 22 is coupled to the even bitlines MBL0, MBL2, MBL4, MBL6 and the source/sensor 22 supplies approximately Vcc/n to the even bitlines MBL0, MBL2, MBL4, MBL6. Similarly, when the pre-control even command drives the gates of the odd pre-charge control transistors PC1, PC3, PC5, PC7, the pre-charge source/sensor 22 is coupled to the odd bitlines MBL1, MBL3, MBL5, MBL7 and the source/sensor 22 supplies approximately Vcc/n to the odd bitlines MBL1, MBL3, MBL5, MBL7.

The source/sensor 22 also senses drain bias level in the memory cells 61-76 as is known in the art when the source voltage is removed by selectively alternating the respective bitline transistors BLT1-BLT16 associated with the respective memory cells 61-76 to be read.

The decoding circuits 30 include even bitline decoder circuit controller 32 and odd bitline decoder circuit controller 34. The decoding circuits 30 include a plurality of common select transistors CS0-CS1 associated with each respective bitline MBL0-MBL7. The output of each of the bitline decoder circuit controllers 32, 34 is controlled by a byte select transistor BSE and BSO, respectively.

The read operation method for a flash memory array 50 includes temporarily pre-charging the plurality of even bitlines MBL0, MBL2, MBL4, MBL6 to about Vcc/n and temporarily pre-charging the plurality of odd bitlines MBL1, MBL3, MBL5, MBL7 to one of a ground and a virtual ground level. The current flowing to/from a first bit location in each of the plurality of memory cells 61-76 is selectively sensed. The first bit location in each of the plurality of memory cells 61-76 is not necessarily consistently the "left" bit or the "right" bit, but rather, the first bit location merely describes one of at least two logical bit locations in each of the plurality of memory cells 61-76. A logical sate status (i.e., logical "1" or "0") is determined from the sensed current on one of the source side and the drain side for the first bit location in each of the plurality of memory cells 61-76 by selectively controlling the bitline transistors BLT1-BLT16 coupled to each of the plurality of memory cells 61-76. The method also includes temporarily pre-charging the plurality of odd bitlines MBL1, MBL3, MBL5, MBL7 to about Vcc/n and temporarily pre-charging the plurality of even bitlines MBL0, MBL2, MBL4, MBL6 to one of a ground and a virtual ground level. The current flowing to/from a second bit location in each of the plurality of memory cells 61-76 is selectively sensed. The second bit location in each of the plurality of memory cells 61-76 is not necessarily consistently the "left" bit or the "right" bit, but rather, the second bit location merely describes another one of the at least two logical bit locations in each of the plurality of memory cells 61-76. A logical sate status (i.e., logical "1" or "0") is determined from the sensed current on one of the source side and the drain side for the second bit location in each of the plurality of memory cells 61-76 by selectively controlling the bitline transistors BLT1-BLT16 coupled to each of the plurality of memory cells 61-76.

Thus, during decoding changeover, there is no power changing which reduces power consumption and noise during decoding changeover. The preferred embodiment leads to faster pre-charging speed, power reduction and noise reduction due to the lower power consumption as compared to Vcc or ground pre-charging.

From the foregoing, it can be seen that the present invention is directed to a memory array having odd/even bitline decoding circuits and a pre-charge circuit that uses about Vcc/n for pre-charging. The preferred embodiment of the present invention includes a method of pre-charging and decoding the memory array using the odd/even bitline decoding circuits and the pre-charge circuit. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A read operation method for a flash memory array having a plurality of memory cells, a plurality of wordlines, a plurality of even numbered bitlines, a plurality of odd numbered bitlines and a plurality of bitline transistors, wherein each even numbered bitline consists of one single bitline, each odd numbered bitline consists of one single bitline, and each even numbered bitline and each odd numbered bitline are alternately arranged, the method comprising:
   temporarily pre-charging only the plurality of even numbered bitlines to about Vcc/n, n being greater than 1;
   temporarily pre-charging only the plurality of odd numbered bitlines to one of a ground and a virtual ground level; and
   after performing the steps of temporarily pre-charging the plurality of even numbered bitlines and odd numbered bitlines, selectively reading a first bit location in one of the plurality of memory cells, wherein the step of selectively reading the first bit location is performed to the plurality of memory cells one-by-one.

2. The read operation method according to claim 1, after selectively reading the first bit locations in the plurality of memory cells, further comprising:
   temporarily pre-charging only the plurality of odd numbered bitlines to about Vcc/n;
   temporarily pre-charging only the plurality of even numbered bitlines to one of a ground and a virtual ground level; and
   after performing the steps of temporarily pre-charging only the plurality of even numbered bitlines and odd numbered bitlines, selectively reading a second bit location in one of the plurality of memory cells, wherein the step of selectively reading the second bit location is performed to the plurality of memory cells one-by-one.

3. The read operation method according to claim 1, wherein n is about 2.

4. A read operation method for a flash memory array having a plurality of memory cells, a plurality of wordlines, a plurality of even numbered bitlines, a plurality of odd numbered bitlines and a plurality of bitline transistors, wherein each even numbered bitline consists of one single bitline, each odd numbered bitline consists of one single bitline, and each even numbered bitline and each odd numbered bitline are alternately arranged, the method comprising:
   temporarily pre-charging only the plurality of even numbered bitlines to about Vcc/n, n being greater than 1;
   temporarily pre-charging only the plurality of odd numbered bitlines to one of a ground and a virtual ground level;
   after performing the steps of temporarily pre-charging only the plurality of even numbered bitlines and odd numbered bitlines, selectively reading a first bit location in one of the plurality of memory cells wherein the step of selectively reading the first bit location is performed to the plurality of memory cells one-by-one; and
   determining a logical state status from the sensed current on one of the source side and the drain side for the first bit location in each of the plurality of memory cells.

5. The read operation method according to claim 4, after determining a logical state status from the sensed current on one of the source side and the drain side for the first bit location in each of the plurality of memory cells, further comprising:
   temporarily pre-charging only the plurality of odd numbered bitlines to about Vcc/n;
   temporarily pre-charging only the plurality of even numbered bitlines to one of a ground and a virtual ground level;
   after performing the steps of temporarily pre-charging only the plurality of even numbered bitlines and odd numbered bitlines, selectively reading a second bit location in one of the plurality of memory cells wherein the step of selectively reading the second bit location is performed to the plurality of memory cells one-by-one; and
   determining a logical state status from the sensed current on one of the source side and the drain side for the second bit location in each of the plurality of memory cells.

6. The read operation method according to claim 4, wherein n is about 2.

7. A read operation method for a flash memory array having a plurality of memory cells, a plurality of wordlines, a plurality of even numbered bitlines, a plurality of odd numbered bitlines and a plurality of bitline transistors, wherein each even numbered bitline consists of one single bitline, each odd numbered bitline consists of one single bitline, and each even numbered bitline and each odd numbered bitline are alternately arranged, the method comprising:

- temporarily pre-charging only the plurality of even numbered bitlines to about Vcc/n, n being greater than 1;
- temporarily pre-charging only the plurality of odd numbered bitlines to one of a ground and a virtual ground level;
- after performing the steps of temporarily pre-charging only the plurality of even numbered bitlines and odd numbered bitlines, selectively reading a first bit location in each of the plurality of memory cells by selectively controlling bitline transistors coupled to one of the plurality of memory cells, wherein the step of selectively reading the first bit location is performed to the plurality of memory cells one-by-one;
- after the step of selectively reading the first bit location in each of the plurality of memory cells, the method comprising:
  - temporarily pre-charging only the plurality of odd numbered bitlines to about Vcc/n;
  - temporarily pre-charging only the plurality of even numbered bitlines to one of a ground and a virtual ground level; and
  - after performing the steps of temporarily pre-charging only the plurality of even numbered bitlines and odd numbered bitlines, selectively reading a second bit location in each of the plurality of memory cells by selectively controlling the bitline transistors coupled to one of the plurality of memory cells wherein the step of selectively reading the second bit location is performed to the plurality of memory cells one-by-one.

8. The read operation method according to claim 7, wherein n is about 2.

* * * * *